(12) United States Patent
Horch et al.

(10) Patent No.: US 7,123,508 B1
(45) Date of Patent: Oct. 17, 2006

(54) REFERENCE CELLS FOR TCCT BASED MEMORY CELLS

(75) Inventors: Andrew Horch, Sunnnyvale, CA (US); Tapan Samaddar, Sunnyvale, CA (US)

(73) Assignee: T-RAM, Inc., San Jose, CA (US)

( * ) Notice: Subject to any disclaimer, the term of this patent is extended or adjusted under 35 U.S.C. 154(b) by 0 days.

(21) Appl. No.: 10/919,956

(22) Filed: Aug. 17, 2004

Related U.S. Application Data

(60) Division of application No. 10/167,382, filed on Jun. 10, 2002, now Pat. No. 6,781,888, which is a continuation-in-part of application No. 10/100,705, filed on Mar. 18, 2002.

(51) Int. Cl.
*G11C 7/00* (2006.01)

(52) U.S. Cl. ....................................... 365/159; 365/175

(58) Field of Classification Search ................. 365/159, 365/175, 210, 189.09
See application file for complete search history.

(56) References Cited

U.S. PATENT DOCUMENTS

| | | | |
|---|---|---|---|
| 4,700,329 A | 10/1987 | Yamada et al. | |
| 4,943,944 A | 7/1990 | Sakui et al. | |
| 5,136,184 A | 8/1992 | Deevy | |
| 5,291,437 A | 3/1994 | Rountree | |
| 5,390,145 A * | 2/1995 | Nakasha et al. ............ | 365/159 |
| 5,424,977 A | 6/1995 | Rountree | |
| 5,468,983 A | 11/1995 | Hirase et al. | |
| 5,532,955 A | 7/1996 | Gillingham | |
| 5,572,459 A | 11/1996 | Wilson et al. | |
| 5,641,699 A | 6/1997 | Hirase et al. | |
| 5,673,221 A | 9/1997 | Calligaro et al. | |
| 5,689,471 A | 11/1997 | Voss et al. | |
| 5,714,894 A | 2/1998 | Redman-White et al. | |
| 5,748,534 A | 5/1998 | Dunlap et al. | |
| 5,822,237 A | 10/1998 | Wilson et al. | |
| 5,838,612 A | 11/1998 | Calligaro et al. | |
| 5,856,748 A | 1/1999 | Seo et al. | |
| 5,930,323 A * | 7/1999 | Tang et al. .................... | 377/77 |
| 5,936,888 A * | 8/1999 | Sugawara ................ | 365/185.2 |
| 5,982,677 A | 11/1999 | Fontana et al. | |
| 6,031,777 A | 2/2000 | Chan et al. | |
| 6,147,518 A | 11/2000 | Hughes | |
| 6,229,161 B1 | 5/2001 | Nemati et al. | |
| 6,590,820 B1 | 7/2003 | Nakagawa | |

* cited by examiner

*Primary Examiner*—Vu A. Le

(57) ABSTRACT

A reference cell produces a reference current that is about half of the current produced by a memory cell. The reference cell is essentially the same as the memory cell with an additional current reduction device that can be a transistor. Adjusting a reference voltage applied to the transistor allows the reference current to be varied. A control circuit to produce the reference voltage includes dedicated memory and reference cells and a feedback circuit that compares the two cells' currents. The feedback circuit applies the reference voltage to the reference cell of the control circuit and adjusts the reference voltage until the current from the reference cell is about half of the current from the memory cell. The reference voltage is then applied to other reference cells in a memory array.

3 Claims, 13 Drawing Sheets

REFERENCE CELLS FOR TCCT BASED MEMORY CELLS

CROSS-REFERENCE TO RELATED APPLICATIONS

This application is a divisional of U.S. patent application Ser. No. 10/167,382 filed Jun. 10, 2002 now U.S. Pat. No. 6,781,888, which is a continuation-in-part of U.S. patent application Ser. No. 10/100,705, filed Mar. 18, 2002. These two parent applications are incorporated herein by reference.

BACKGROUND OF THE INVENTION

1. Field of the Invention

The present invention relates generally to the field of semiconductor capacitively coupled negative differential resistance ("NDR") devices for data storage, and more particularly to reference cells to be used therewith.

2. Description of the Prior Art

U.S. Pat. No. 6,229,161 issued to Nemati et al., incorporated herein by reference in its entirety, discloses capacitively coupled NDR devices for use as SRAM memory cells. The cells disclosed by Nemati et al. are hereinafter referred to as thinly capacitively coupled thyristor ("TCCT") based memory cells. FIG. 1 shows a pair of representative TCCT based memory cells 10 as disclosed by Nemati et al., and FIG. 2 shows a cross-section through one TCCT based memory cell 10 along the line 2—2. FIG. 3 shows a schematic circuit diagram corresponding to the embodiment illustrated in FIGS. 1 and 2. The TCCT based memory cell 10 includes an NDR device 12 and a pass transistor 14. A charge-plate or gate-like device 16 is disposed adjacent to, and in the case of the illustrated embodiment, surrounding, the NDR device 12. A P+ region 18 of the NDR device 12 is connected to a metallization layer 20 so that a first voltage $V_1$, such as $V_{ddarray}$, can be applied to the NDR device 12 through the P+ region 18. An N+ region of the NDR device 12 forms a storage node 22 that is connected to a source of the pass transistor 14. Where the pass transistor 14 is a MOSFET, it can be characterized by a channel length, L, and a width, W, where L is the spacing between the source and the drain, and W is the width of the pass transistor 14 in the direction perpendicular to the page of the drawing in FIG. 2. Assuming a constant applied voltage, a current passed by pass transistor 14 will scale proportionally to a ratio of W/L.

Successive TCCT based memory cells 10 are joined by three lines, a bit line 26, a first word line (WL1) 28, and a second word line (WL2) 30. The bit line 26 connects a drain 32 of pass transistor 14 to successive TCCT based memory cells 10. In a similar fashion, pass transistor 14 includes a gate 34 that forms a portion of the first word line 28. Likewise, the gate-like device 16 forms a portion of the second word line 30.

Memory arrays of the prior art typically include a large number of memory cells that are each configurable to be in either of two states, a logical "1" state or a logical "0" state. The memory cells are typically arranged in rows and columns and are connected to a grid of word lines and bit lines. In this way any specific memory cell can be written to by applying a signal to the appropriate word lines. Similarly, the state of a memory cell is typically manifested as a signal on one of the bit lines. In order to correctly interpret the state of the memory cell from the signal on the bit line, memory arrays of the prior art typically rely on some form of a reference signal against which the signal on the bit line is compared.

One type of memory array of the prior art uses SRAM cells for the memory cells. A conventional SRAM cell stores a voltage and includes two access ports, data and data-bar, where data-bar is a complementary signal to data and serves as a reference. A sensing circuit for the conventional SRAM cell compares the voltages of data and data-bar to determine whether the SRAM cell is storing a "1" or a "0."

Another type of memory array of the prior art uses DRAM cells for the memory cells. A conventional DRAM cell is a capacitor and stores a charge to represent a logical state. When a DRAM cell is read it produces a voltage on a bit line. A typical reference cell for a DRAM memory array is a modified DRAM cell designed to store about half as much charge as the conventional DRAM cell. Accordingly, in a DRAM memory array the voltage produced by the DRAM cell is compared to the voltage produced by the reference cell to determine whether the DRAM cell is storing a "1" or a "0."

In comparison to the conventional SRAM cell, a TCCT based memory cell 10 has only a single port, namely bit line 26. In further comparison to both the SRAM and DRAM cells, the TCCT based memory cell 10 does not produce a voltage but instead produces a current. More specifically, TCCT based memory cell 10 has an "on" state wherein it generates a current that is received by bit line 26. TCCT based memory cell 10 also has an "off" state wherein it produces essentially no current. Accordingly, voltage-based reference cells of the prior art are inadequate for determining the state of a TCCT based memory cell 10 and a new type of reference is needed.

A reference cell to be used in a memory array of TCCT based memory cells 10 should produce a reference current with an amount that is somewhere within the range defined by the currents generated by TCCT based memory cell 10 in the "on" and "off" states, and preferably about half the magnitude of the current generated by TCCT based memory cell 10 in the "on" state. It is well known, however, that the amount of current produced by TCCT based memory cell 10 varies as a function of temperature, variations in manufacturing, operating conditions (i.e., voltages), among other things. Therefore, what is desired is a reference cell capable of generating a reference current that will remain at a suitable magnitude such as about half the intensity of the current generated by a TCCT based memory cell 10 in the "on" state despite variations in manufacturing and operating conditions.

SUMMARY

A reference cell for a TCCT based memory cell includes an NDR device, a switch, and a current reduction element arranged together with a bit line and two word lines. The NDR device includes a doped semiconductor layer between first and second ends, the first end configured to have a first voltage applied thereto. The NDR device also includes a gate-like device disposed adjacent to the doped semiconductor layer. The switch is preferably a pass transistor that includes a source coupled to the second end of the NDR device, a drain, and a gate coupled to the first word line. The second word line is coupled to the gate-like device. The current reduction element is coupled between the bit line and the drain of the pass transistor. In some embodiments the current reduction element is a second pass transistor including a gate having a second voltage applied thereto. In these embodiments the reference cell produces an amount of current that is sufficient to be used as a reference. By applying an appropriate voltage to the second pass transistor, the second pass transistor can be made to have an appropriate resistance such that the desired current reduction is obtained.

These embodiments are advantageous in that a reference cell can be made to be in every respect the same as a TCCT based memory cell with the additional feature of a current reduction element. This way a reference current produced by the reference cell will be less than the amount of current produced by the TCCT based memory cell in the "on" state. In other embodiments the same advantages are achieved with an NDR device as described coupled to a single pass transistor. In these embodiments a voltage is applied to a gate of the single pass transistor such that it produces a resistance equal to the sum of the resistances of the first and second pass transistors in the previous embodiments.

Other embodiments of the invention are directed to a circuit for generating a reference voltage to control a current output of a reference cell. These embodiments allow the current output from a reference cell of the invention to be continuously maintained at any desired value, though preferably at about half of the amount of current produced by a TCCT based memory cell. The circuit to generate a reference voltage includes a TCCT based memory cell to produce a first current, a pair of reference cells as described above, each producing a current, and a feedback circuit. In these embodiments the reference cell produces the reference voltage from the feedback circuit which varies the reference current as a function of the difference between the first current and the sum of the two currents from the reference cells. The generated reference voltage is also applied to the second pass transistors to provide feedback to the two reference cells.

In specific embodiments the reference voltage is adjusted so that each reference cell produces a current equal to half of the current produced by the TCCT based memory cell. These embodiments can be advantageously used to apply the same reference voltage to a pass transistor in another reference cell outside of the circuit so that it will also produce a current equal to half of the current produced by the memory cell.

Other embodiments of the invention are directed to a memory array including a TCCT based memory cell coupled to a first bit line, a reference cell coupled to a second bit line, and means for determining a state of the TCCT based memory cell by comparing a first current on the first bit line and a second current on the second bit line. Still other embodiments of the memory array further include a circuit to generate a reference voltage to control a current output of a reference cell, as described above.

Still other embodiments are directed to a method of producing a reference current against which a current from a TCCT based memory cell can be compared. In these embodiments a reference cell and a circuit to produce a reference voltage are both provided. The reference cell includes an NDR device configured to produce a current and a pass transistor connected to the NDR device. The circuit is configured to produce a reference voltage that is applied to the gate of the pass transistor. In this way a current produced by the NDR device is reduced by the resistance of the pass transistor so that a reference current is obtained. The degree to which the current produced by the NDR device is reduced is determined by the magnitude of the reference voltage applied to the gate of the pass transistor.

Yet other embodiments are directed to a method for reading a state of a TCCT based memory cell. In these embodiments the method includes operating the TCCT based memory cell to produce a first current on a first bit line, operating a reference cell to produce a second current on a second bit line, operating a circuit to provide a reference voltage to the reference cell, and comparing the first and second currents. Operating the TCCT based memory cell includes both applying a voltage to one end of the TCCT based memory cell to generate a current, and applying another voltage to a gate of a pass transistor to connect the TCCT based memory cell to the first bit line. The reference cell is similarly operated. The circuit is operated by operating a circuit memory cell and a circuit reference cell. The circuit memory cell is a dedicated TCCT based memory cell that is not used for memory purposes; instead it is used to produce a current that is representative of the current produced by other TCCT based memory cells in an array. The circuit reference cell is also dedicated to the circuit and likewise is used to produce a current that is representative of the current produced by other reference cells in the array. A feedback circuit is configured to receive the currents produced by the circuit memory cell and the circuit reference cell, provide a reference voltage to the circuit reference cell to controls the current output of the circuit reference cell, and to adjust the reference voltage until the current from the circuit reference cell is about half of the current from the circuit memory cell.

BRIEF DESCRIPTION OF DRAWINGS

The present invention is illustrated by way of example, and not by way of limitation, in the figures of the accompanying drawings where like reference numerals frequently refer to similar elements and in which.

DETAILED DESCRIPTION OF THE INVENTION

Figure 4:
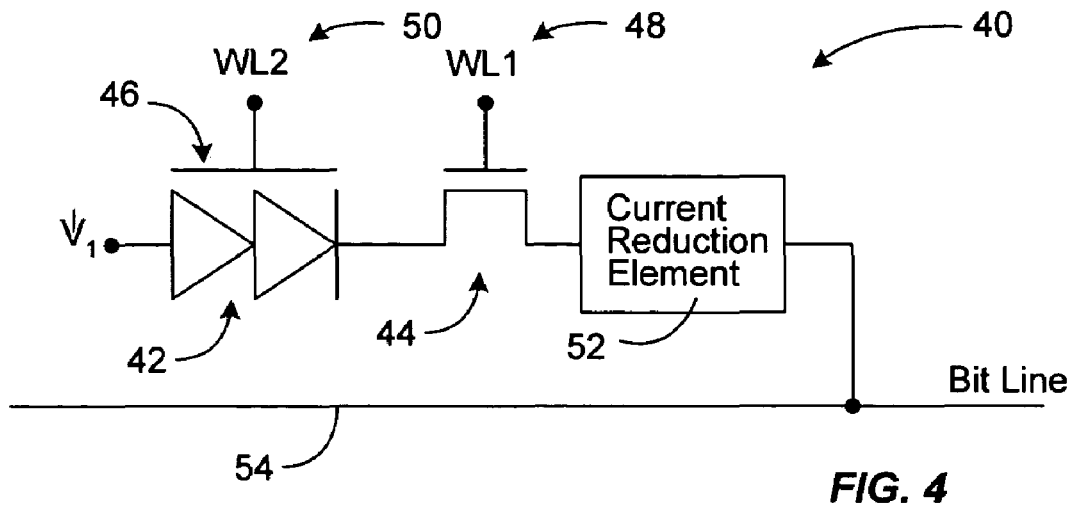
FIG. 4 shows a schematic circuit diagram of an exemplary reference cell of a specific embodiment the invention.

FIG. 4 shows a schematic circuit diagram of an exemplary reference cell 40 in accordance to a specific embodiment of the invention. As in the TCCT based memory cell 10 (FIG. 1), the reference cell 40 includes an NDR device 42 having a first end connected to a source of a pass transistor 44. A gate-like device 46 is disposed adjacent to the NDR device 42. A first word line 48 is connected to a gate of the pass transistor 44, a second word line 50 is connected to the gate-like device 46, and a first voltage $V_1$, such as $V_{ddarray}$, can be applied to the NDR device 42 at a second end.

Figure 1:
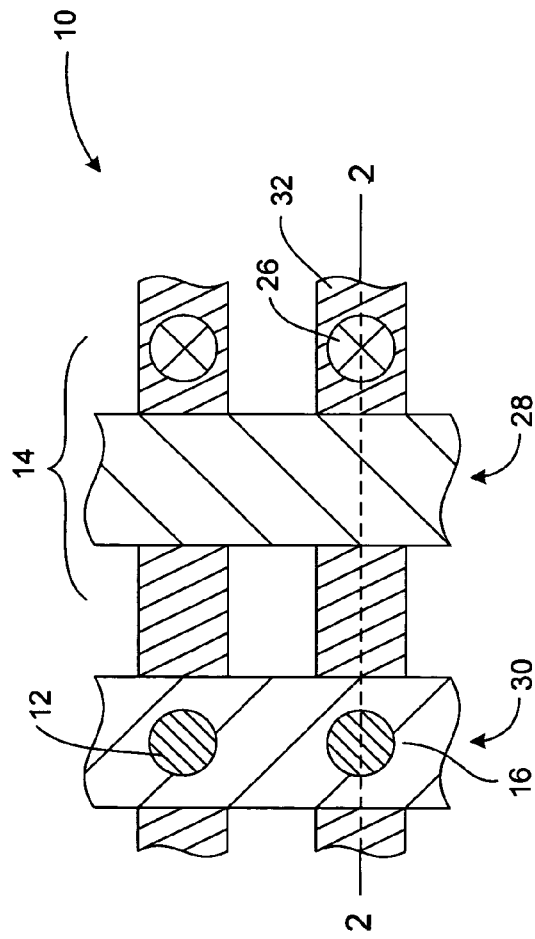
FIG. 1 shows a TCCT based memory cell of the prior art.
Figure 2:
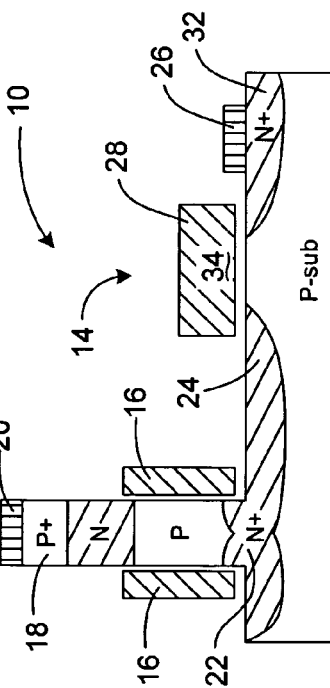
FIG. 2 shows a cross-section of the TCCT based memory cell of FIG. 1.
Figure 3:
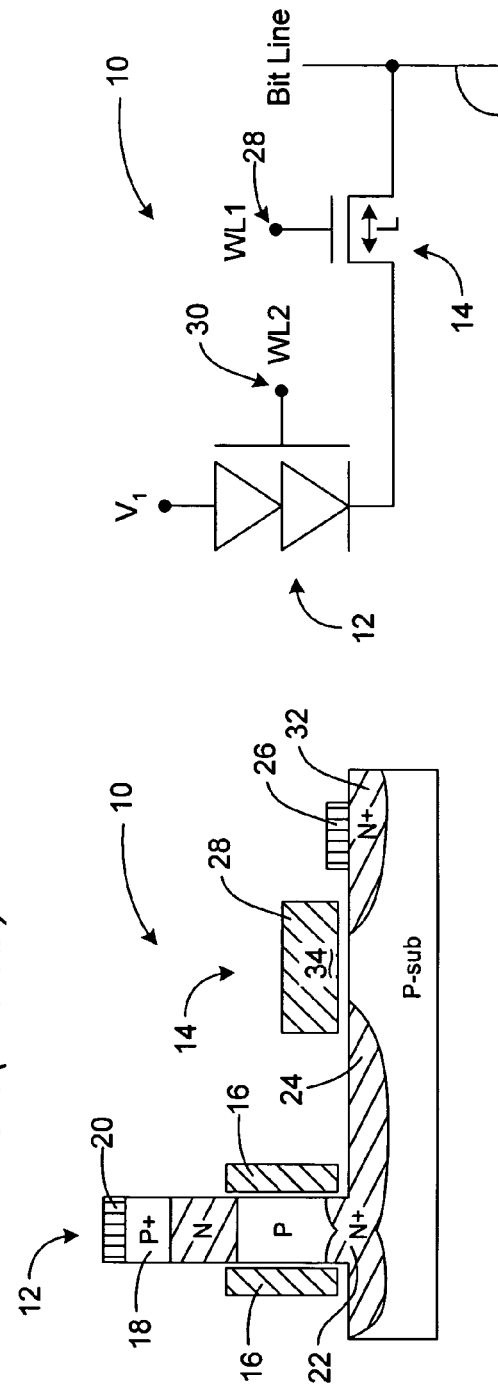
FIG. 3 shows a schematic circuit diagram of the TCCT based memory cell of FIG. 1.

Reference cell 40 also includes a current reduction element 52 connected between a drain of the pass transistor 44 and a bit line 54. The current reduction element 52 prevents a certain amount of a current produced by the NDR device 42 from reaching the bit line 54. In a specific embodiment, the current reduction element 52 reduces the current reaching the bit line 54 by a predetermined amount such as about ½. Current reduction element 52 can take many forms, the simplest of which is a resistor having an appropriate resistance. In other embodiments, current reduction element 52 is a transistor and the appropriate resistance is produced by adjusting a gate length. In a similar fashion, instead of adding a separate element as the current reduction element 52, the function is added to pass transistor 44 by providing it with a longer gate length than a pass transistor 14 (FIG. 1). Another method for reducing the current reaching the bit line 54 is to vary aspects of the NDR device 42 in such a way as to decrease its current output when in a low resistance ("on") state, for example by providing the NDR device 42 with a narrower gate width. Each of these reference cell 40 embodiments is capable of producing a reference current, however, none effectively produce a reference current that varies proportionally with a current from a TCCT based memory cell 10 (FIG. 1) as temperature is varied so that the desired ½ ratio is maintained. Manufacturing variability over each process corner can also make it difficult to produce the desired ½ ratio in these embodiments. In another example, current reduction element 52 has a variable resistance so that the desired current can be maintained on the bit line 54 by increasing as well as decreasing the resistance of current reduction element 52.

Figure 5:
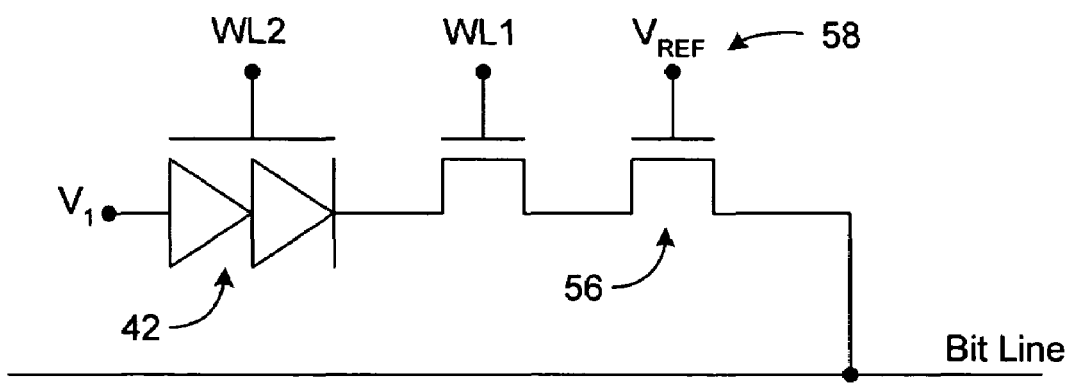
FIG. 5 shows a schematic circuit diagram of another example of a reference cell in accordance with another embodiment of the invention.

FIG. 5 shows a second pass transistor 56 serving to reduce the current from the NDR device 42. The second pass transistor 56 is controlled by a variable reference voltage $V_{REF}$ 58. A feedback loop monitoring the current on the bit line 54 can be used to continuously adjust the reference voltage 58 to adjust the resistance of the second pass transistor 56.

Figure 6A:
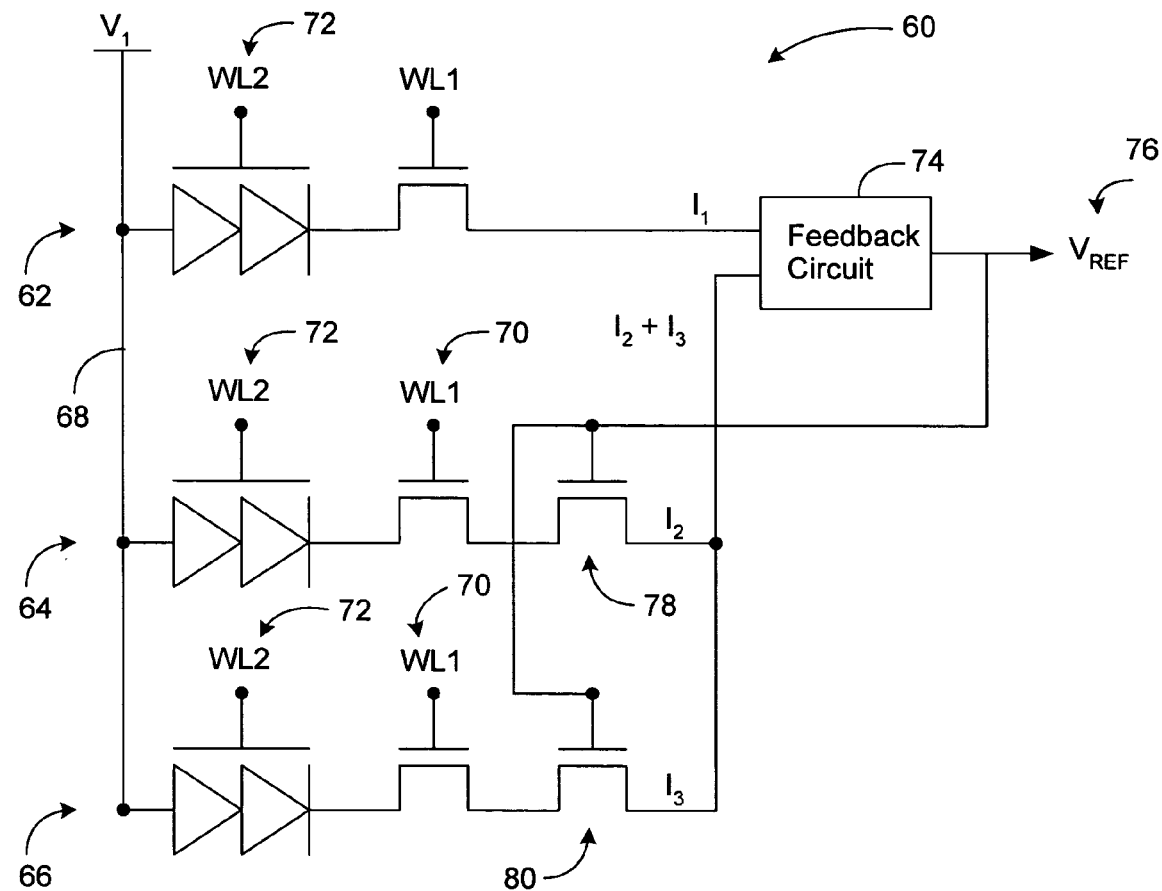
FIG. 6A shows a schematic circuit diagram of an exemplary NDR based reference voltage generator circuit according to an embodiment of the invention.

FIG. 6A shows a schematic circuit diagram of an exemplary reference voltage generator circuit 60 including a TCCT based memory cell 62 and two reference cells 64 and 66. All three cells 62, 64, and 66 are connected to a common line 68 carrying a first voltage $V_1$ and to common first and second word lines 70 and 72, as shown. Accordingly, all three cells 62, 64, and 66 operate in parallel such that all three produce current at the same time. The TCCT based memory cell 62 produces a first current $I_1$ and the two reference cells 64 and 66 produce second and third currents $I_2$ and $I_3$, respectively.

The reference voltage generator circuit 60 also includes a feedback circuit 74. The feedback circuit 74 is configured to receive two inputs, $I_1$ from the TCCT based memory cell 62 and the summed currents $I_2$ and $I_3$ from reference cells 64 and 66. Ideally, $I_2$ and $I_3$ should always be the same as reference cells 64 and 66 are fabricated to be the same and are operated by the same voltages. The feedback circuit 74 is also configured to output a variable reference voltage $V_{REF}$ 76. The variable reference voltage $V_{REF}$ 76 is configured to be applied to the second pass transistors 78 and 80. It can be seen that as variable reference voltage $V_{REF}$ 76 is varied the resistances of second pass transistors 78 and 80 also vary and that the currents $I_2$ and $I_3$ also vary. It can further be seen that the feedback circuit 74 can therefore continually adjust the variable reference voltage $V_{REF}$ 76 so that $I_2+I_3$ is maintained to be equal to $I_1$. Provided that $I_2$ equals $I_3$, when $I_2+I_3=I_1$ then each of $I_2$ and $I_3$ is equal to ½$I_1$.

It will be understood that the embodiment shown in FIG. 6A is but one specific embodiment. In another embodiment, two or more TCCT based memory cells 62 are employed and their output currents are summed before entering the feedback circuit 74. In this embodiment, for each additional TCCT based memory cell 62 two more reference cells 64 and 66 are also added. For example, where 3 TCCT based memory cells 62 are employed, the outputs of 6 reference cells would be summed as the second input to the feedback circuit 74. While this embodiment requires more devices and uses more space on a die, it has the advantage that the variable reference voltage $V_{REF}$ 76 is the product of an averaging over many cells and is therefore less sensitive to minor variations between the cells. In still other embodiments different ratios of reference cells to TCCT based memory cells 62 are employed. For example, 4 reference cells to one TCCT based memory cell 62 would yield a variable reference voltage $V_{REF}$ 76 that when applied to a reference cell would cause the reference cell to produce a current equal to ¼$I_1$. Other examples can be readily envisioned by one having ordinary skill in the art.

Figure 6B:
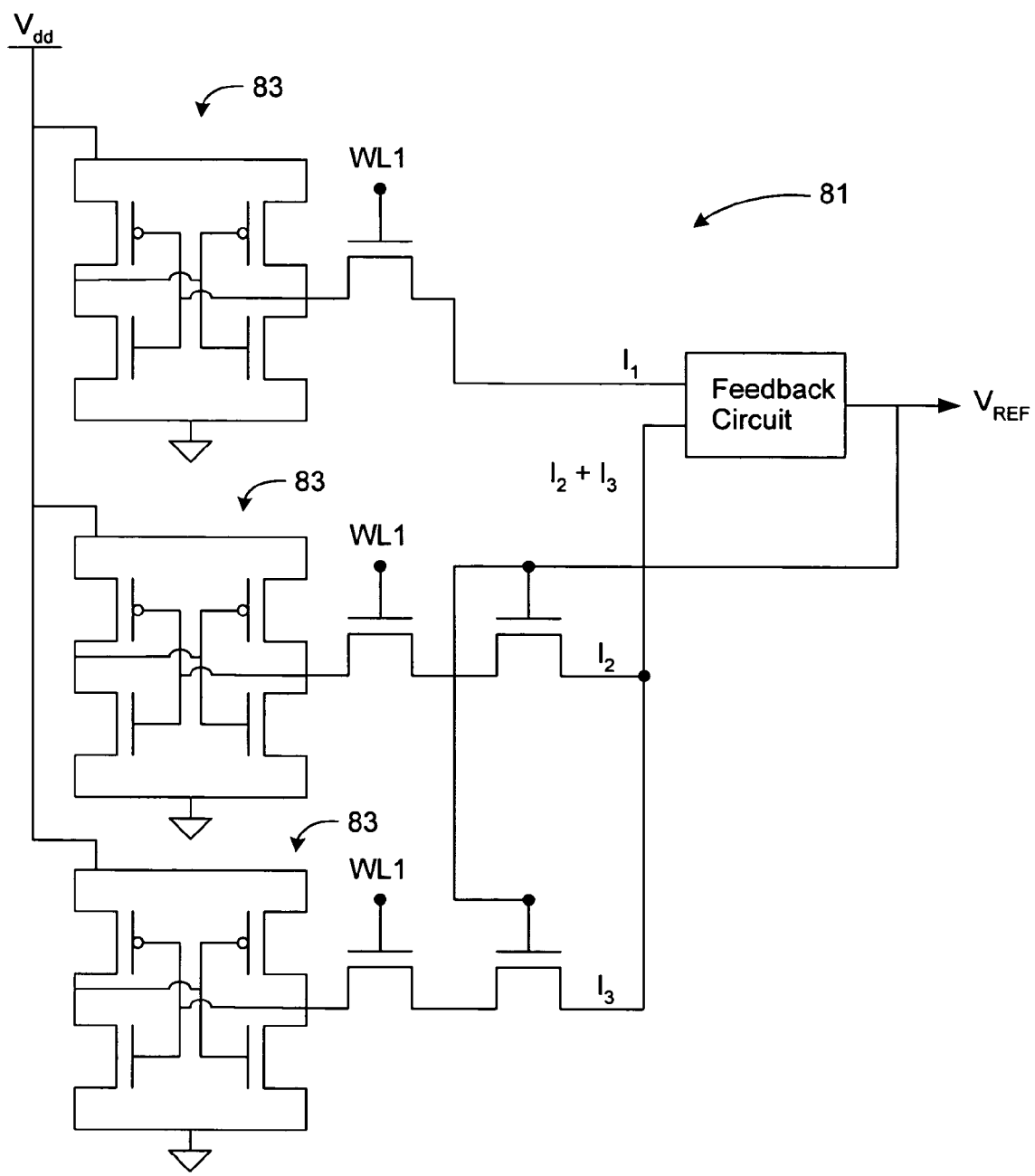
FIG. 6B shows a schematic circuit diagram of an exemplary SRAM based reference voltage generator circuit according to an embodiment of the invention.
Figure 6C:
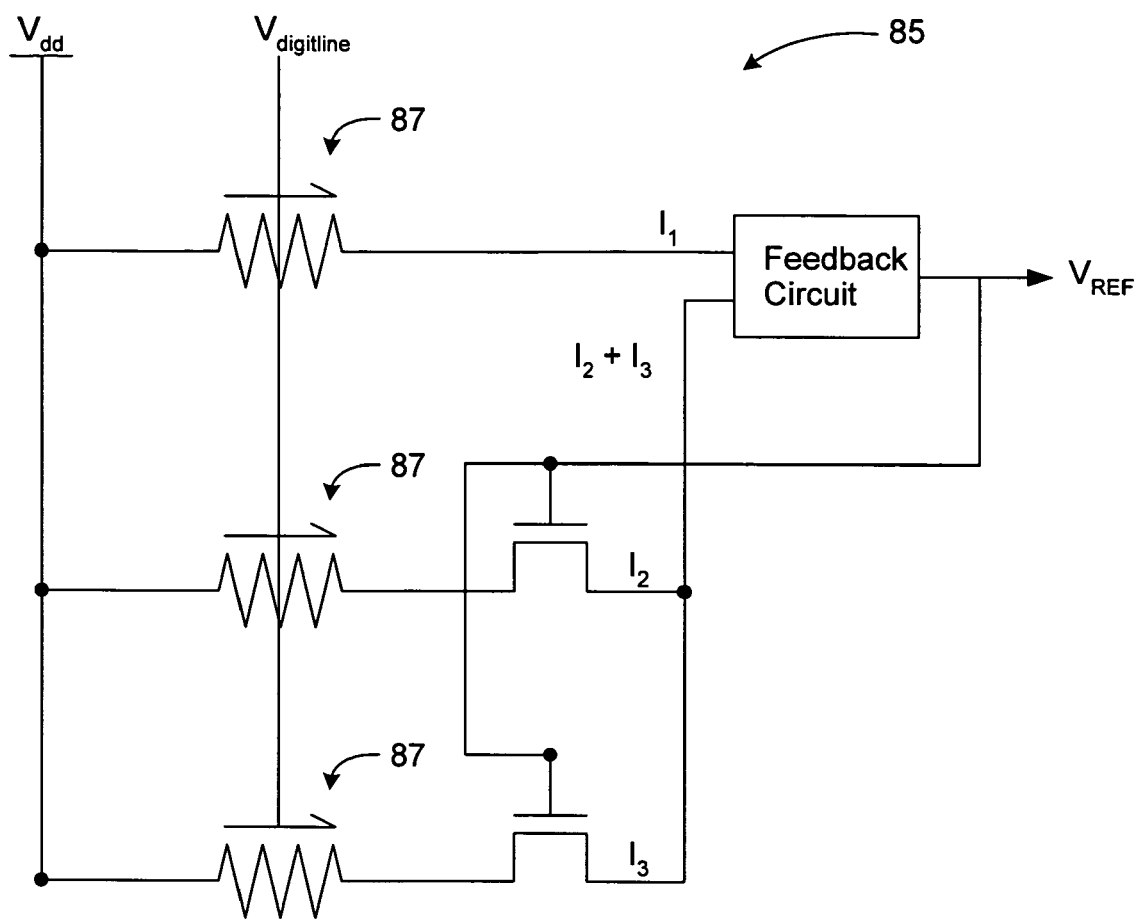
FIG. 6C shows a schematic circuit diagram of an exemplary MRAM based reference voltage generator circuit according to an embodiment of the invention.
Figure 6D:
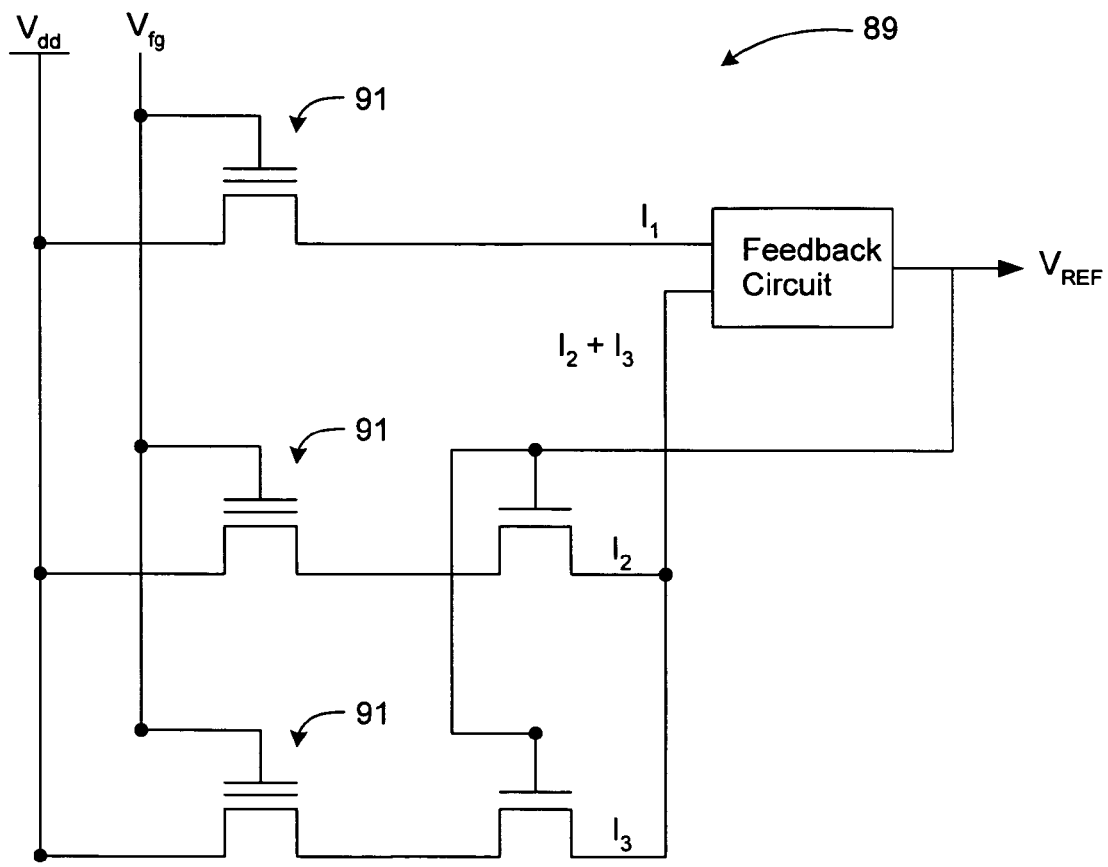
FIG. 6D shows a schematic circuit diagram of an exemplary flash memory based reference voltage generator circuit according to an embodiment of the invention.

It will also be understood that although the embodiments shown in the various drawings such as FIG. 6A are specific to NDR devices and TCCT based memory cells, the invention is more broadly applicable to any memory device that produces a variable current depending on a stored state. As an example, FIG. 6B illustrates another embodiment of a reference voltage generator circuit 81 in which the NDR devices have been replaced with SRAM cells 83. Similarly, FIGS. 6C and 6D illustrate additional embodiments of a reference voltage generator circuit 85, 89 in which the NDR devices have been replaced either with MRAM cells 87 or memory cells with floating gates such as flash memory cells 91. It will be further apparent that in the present invention it is possible to use a combination of different current-producing memory devices. For example, in FIG. 6A the reference cells 64 and 66 can be made with SRAM cells 83 as in FIG. 6B, while the memory cell 62 can include an NDR device as shown.

Figure 7:
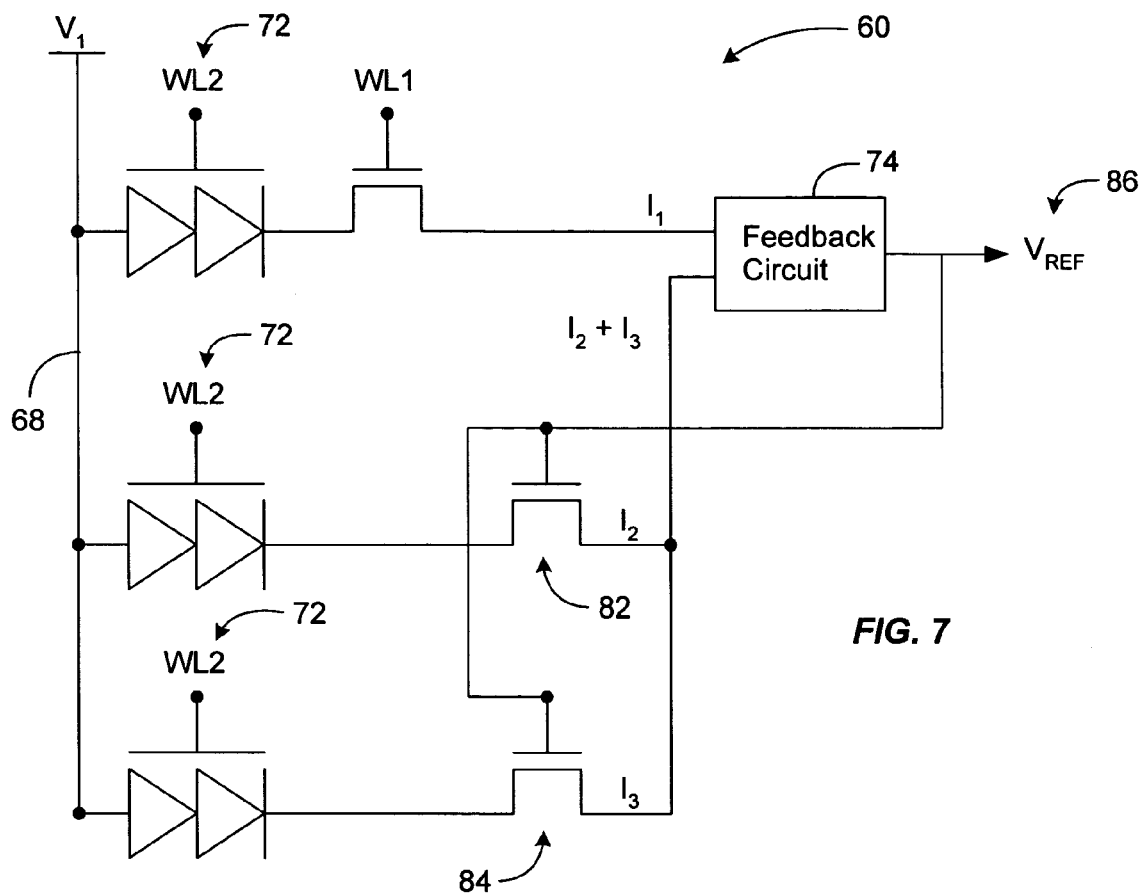
FIG. 7 shows a schematic circuit diagram of another example of a reference voltage generator circuit of another embodiment of the present invention.

In yet another embodiment, the first pass transistors of the reference cells are removed, as shown in FIG. 7. Instead, second pass transistors 82 and 84 are made to each have a resistance greater than the resistances of second pass transistors 78 and 80 (FIG. 6A) by the additional resistance of the pass transistor 44 (FIG. 4). Second pass transistors 82 and 84 can be made to have the additional resistance, for example, by operating at a variable reference voltage $V_{REF}$ 86 that is higher than the variable reference voltage $V_{REF}$ 76 (FIG. 6A). The additional resistance can also be obtained by adjusting a gate length of each of the second pass transistors 82 and 84. In another embodiment, the pass transistor associated with WL1 and $I_1$ is optional and is absent from the circuit depicted in FIG. 7.

Referring back to FIG. 5, it will be apparent that the variable reference voltage $V_{REF}$ 76 can also be applied to the second pass transistor 56 of a reference cell outside of the reference voltage generator circuit 60 to generate a current on bit line 54 equal to ½$I_1$. Because the variable reference voltage $V_{REF}$ 76 of FIG. 7 is variable, as conditions such as temperature change causing the current $I_1$ to change, the feedback circuit 74 can continually adjust the variable reference voltage $V_{REF}$ 76 so that the currents $I_2$ and $I_3$ each remain equal to ½$I_1$. Similarly, the current on bit line 54 of FIG. 5 will also be adjusted to remain equal to ½$I_1$ as the conditions vary, provided that the conditions vary uniformly over the reference voltage generator circuit 60 and the outside reference cell which could be, for example, on a different part of the same die. In some embodiments, to increase the ratio of memory cells to reference cells in order to increase the overall density of memory cells on a die, a single reference cell will be located in a central location such as next to a sense amplifier configured to compare an output current from the reference cell to an output current from any of the memory cells.

Figure 8:
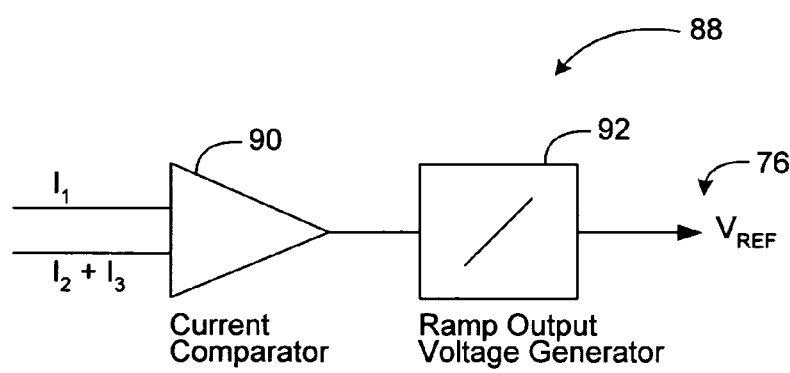
FIG. 8 shows a block diagram illustrating an example of a feedback circuit according to an embodiment of the invention.

FIG. 8 is a block diagram illustrating one possible feedback circuit 88 including a current comparator 90 and a ramp output voltage generator 92 in accordance with a specific embodiment of the invention. The current comparator 90 continuously monitors the first current $I_1$ and the sum of currents $I_2$ and $I_3$. If the sum of currents $I_2$ and $I_3$ is greater than $I_1$ the current comparator 90 signals the ramp output voltage generator 92 to be in an active state in which it progressively decreases the voltage of variable reference voltage $V_{REF}$ 76. Decreasing the variable reference voltage $V_{REF}$ 76 will, in turn, decrease the summation of currents $I_2$ and $I_3$. Once the sum of currents $I_2$ and $I_3$ equals or falls just slightly below the first current $I_1$ the current comparator 90 signals the ramp output voltage generator 92 to be in an inactive state in which the voltage of variable reference voltage $V_{REF}$ 76 is held constant. In another embodiment, once the sum of currents $I_2$ and $I_3$ equals or falls just slightly below the first current $I_1$ the current comparator 90 signals the ramp output voltage generator 92 to be in an active state in which it progressively increases the voltage of variable reference voltage $V_{REF}$ 76. Increasing the variable reference voltage $V_{REF}$ 76 will, in turn, increase the summation of currents $I_2$ and $I_3$ until the summed currents equal the first current $I_1$. One having ordinary skill in the art should appreciate that the feedback circuit can operate to ramp up or down the reference voltage to properly set the reference current.

Figure 9:
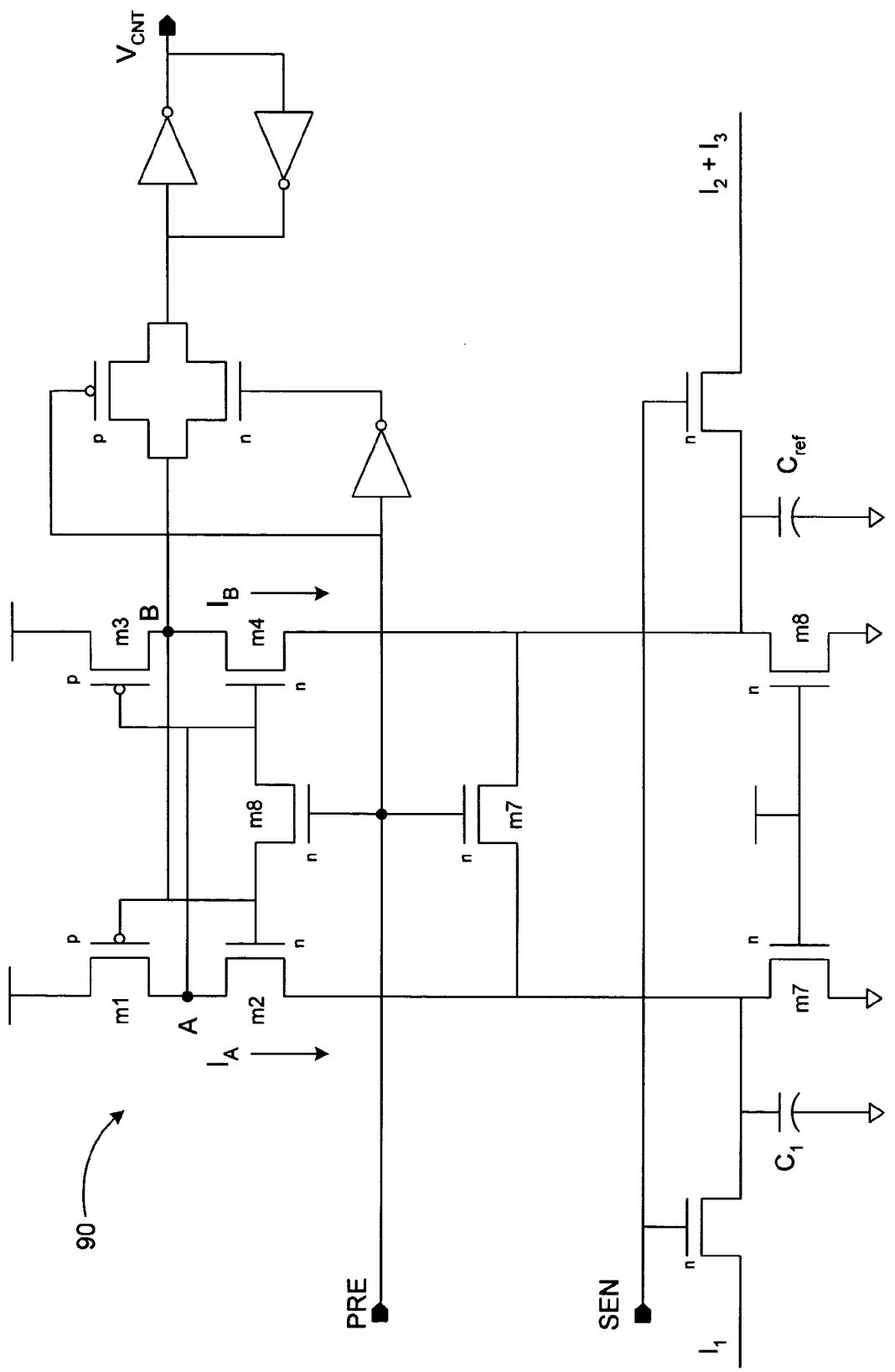
FIG. 9 shows a schematic circuit diagram of an example of a current comparator of the invention.

FIG. 9 shows a schematic circuit diagram of an exemplary current comparator 90. Although the particular embodiment shown in FIG. 9 operates on an appropriate duty cycle to periodically compare the first current $I_1$ with the sum of currents $I_2$ and $I_3$, it will be understood that a current comparator 90 can also operate with continuous sampling. In the exemplary current comparator depicted in FIG. 9, MOSFET devices $M_1$, $M_2$, $M_3$ and $M_4$ form a CMOS cross-coupled latch operating as a high gain positive feedback amplifier where such configuration is well known in the art. MOSFET devices $M_5$ and $M_6$ are biased in their linear regions and provide for a low-impedance clamp between the input currents and a common potential, such as ground. The current comparator operates in two phases: (1) a pre-charge phase and (2) a sensing phase. In the pre-charge phase, the pre-charge signal is high and the sense signal is low. Device $M_7$ and $M_8$ are activated and thus equalize the potentials of devices $M_2$ and $M_4$ (i.e., logic low or ground). Therefore, the voltage at node A is driven to be equal to node B (i.e., $V_A$ equals $V_B$). In an alternate embodiment, the geometric ratios and sizes of devices $M_3$ and $M_4$ are designed to be different than devices $M_1$ and $M_2$ so that the point at which a current difference triggers a difference in voltages at nodes A and B is optimized. One having ordinary skill in the art should appreciate how to implement such design considerations by configuring the appropriate device size.

During the sensing phase, the pre-charge signal is low and the sense signal is high. Currents $I_1$ and the sum of currents $I_2$ and $I_3$ flow into devices $M_5$ and $M_6$, respectively. Differences between currents $I_1$ and the sum of currents $I_2$ and $I_3$ generates a difference in between currents $I_A$ and $I_B$, which in turn leads to a difference in voltages between nodes A and B. For example, if the sum of currents $I_2$ and $I_3$ is greater than current $I_1$, then the capacitor $C_{ref}$ will contain more charge over time (i.e., discharges slower) than $C_1$. With $C_{ref}$ having more charge over time than $C_1$, the voltage at node B is shifted to a higher potential than node A.

As the voltage at node B increases and approaches a higher potential (e.g., $V_{dd}$), the degree in which device $M_2$ is turned on also increases. When $M_2$ is turned on, node A reaches a potential of about zero volts while conversely node B increases to high potential, such as $V_{dd}$, as device $M_3$ increasingly turns on. Therefore, if the sum of currents $I_2$ and $I_3$ is greater than current $I_1$, node B will be driven high and that state will be latched into the latch as $V_{cnt}$. Otherwise, if the sum of currents $I_2$ and $I_3$ is less than current $I_1$, node B will be driven low and that state will be latched into the latch as $V_{cnt}$.

Figure 10:
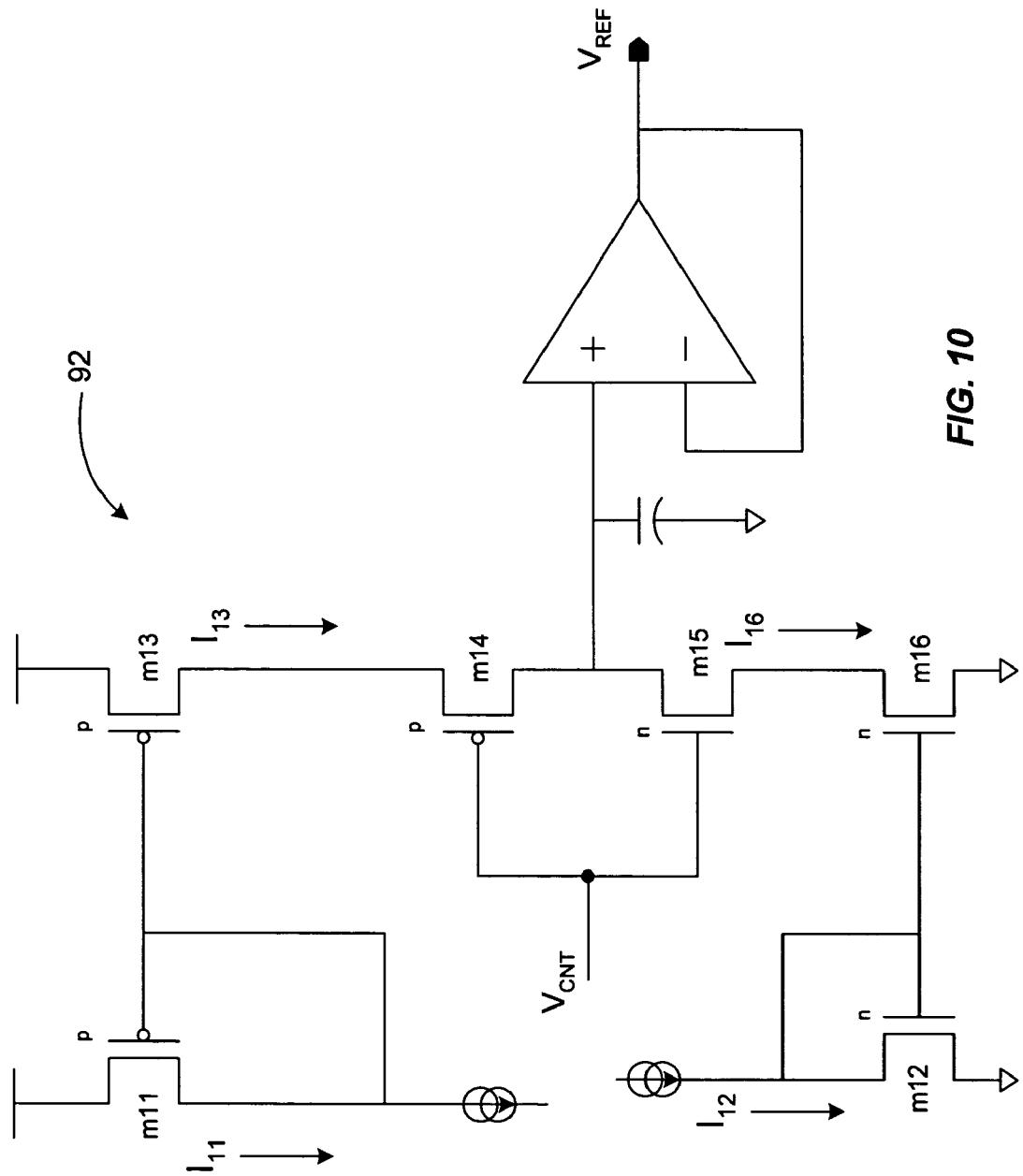
FIG. 10 shows a schematic circuit diagram of an example of a ramp output voltage generator of the invention.

FIG. 10 shows a schematic circuit diagram of but one possible embodiment of a ramp output voltage generator 92 according to the present invention. Devices $M_{11}$ and $M_{13}$ and devices $M_{12}$ and $M_{16}$ form current mirrors designed so that $I_{13}$ mirrors $I_{11}$ and $I_{16}$ mirrors $I_{12}$. Currents $I_{12}$ and $I_{11}$ are generated by constant current sources as are known in the art. Devices $M_{14}$ and $M_{15}$ operate as switches to either charge or discharge the capacitor at the positive input of the amplifier. For example, if node B latches $V_{cnt}$ at a high level, device $M_{15}$ will be turned on, thus discharging the capacitor. In turn, the voltage difference between the amplifier inputs will be as such as to decrease the variable reference voltage $V_{ref}$. In particular, when the sum of currents $I_2$ and $I_3$ is greater than current $I_1$, $V_{ref}$ will decrease to reduce the sum of currents $I_2$ and $I_3$ until the sum is substantially equivalent to current $I_1$. The opposite actions occur when node B latches $V_{cnt}$ at a low level and turns on device $M_{14}$ to charge the capacitor. One having ordinary skill in the art should appreciate how to adapt and to modify the exemplary circuits shown in FIGS. 9 and 10 to practice the present invention.

Figure 11:
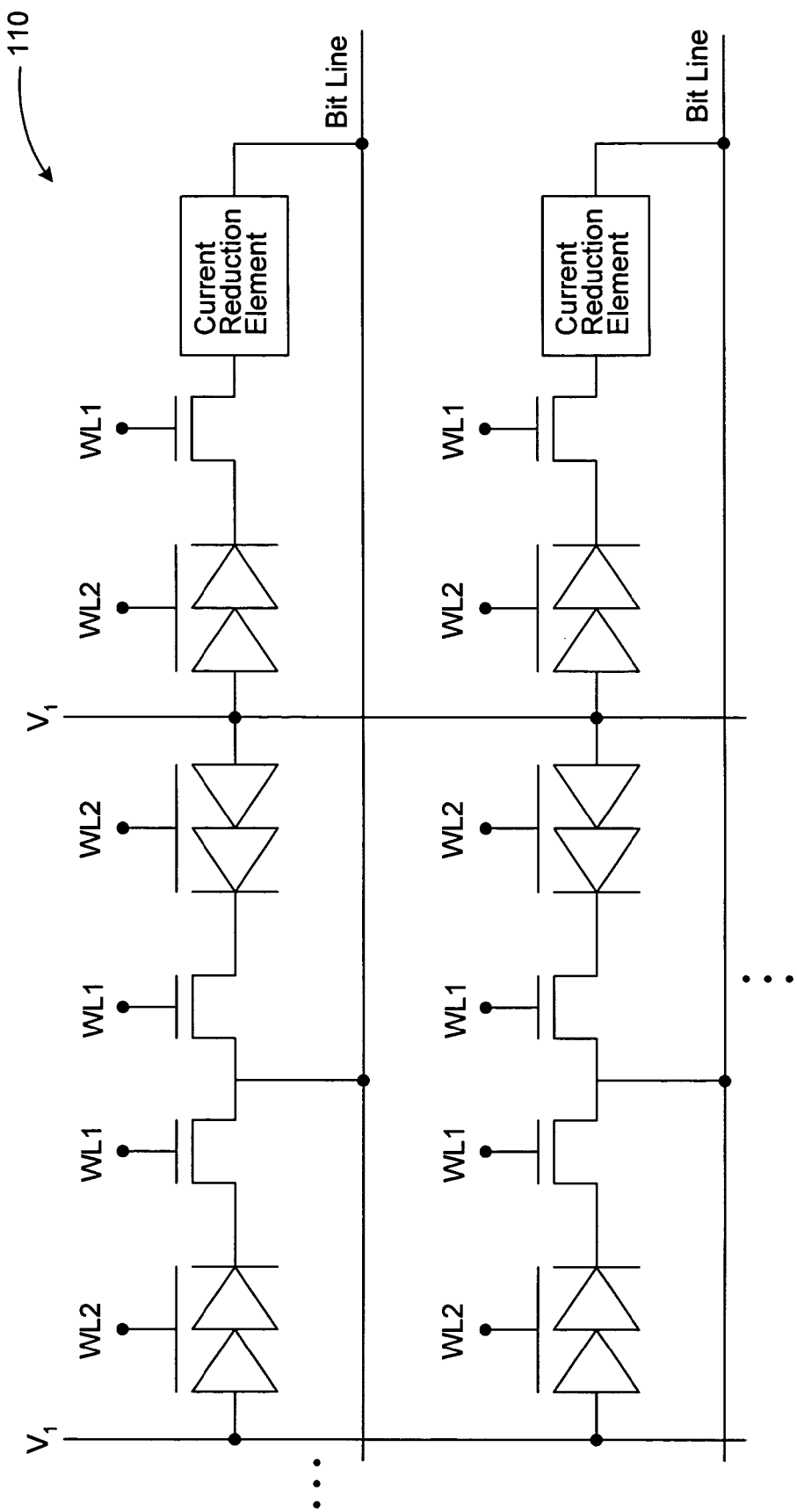
FIG. 11 shows a memory array including an exemplary reference cell for each bit line in accordance with a specific embodiment.

FIG. 11 shows a memory array 110 including a plurality of TCCT based memory cells arranged by rows and columns. Each row includes a series of TCCT based memory cells and a reference cell sharing a common bit line. During a read operation a TCCT based memory cell in a first row produces a current on a first bit line while a reference cell in another row produces a reference current on another bit line. A controller (not shown) contains logic required to select individual TCCT based memory cells and to select a reference cell on a different bit line. The two currents on the two bit lines are then compared, for example, at a sense amplifier to determine the state of the TCCT based memory cell. In other embodiments, the memory array includes a single reference cell near the sense amplifier instead of devoting space to a reference cell on each row in the memory array 110. In other embodiments a reference cell is placed on every $n^{th}$ row. Many other variations will be readily apparent to one having ordinary skill in the art.

Figure 12:
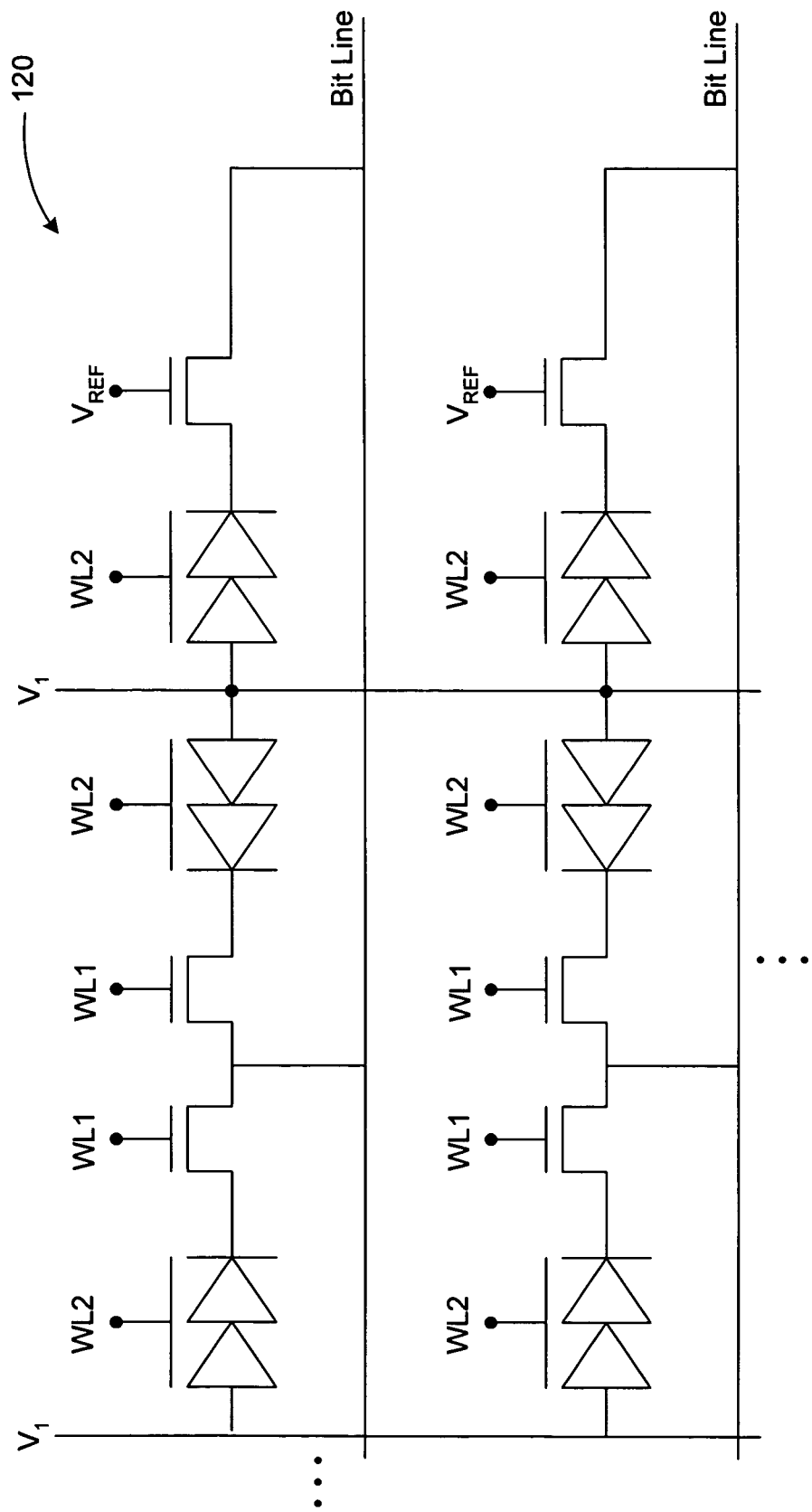
FIG. 12 shows another memory array including another example of a reference cell for each bit line in accordance with another embodiment.

FIG. 12 shows a memory array 120 that is similar to memory array 110. Memory array 120 differs from memory array 110 only in that the reference cells are of the embodiment used in the circuit shown in FIG. 7. It will be appreciated that the exemplary reference cell circuit shown in FIG. 7 is compatible in use with memory array 120 shown in FIG. 12. Similarly, the exemplary reference cell circuit shown in FIG. 6A is likewise compatible in use with memory array 110 shown in FIG. 11.

Referring again to FIG. 6A, it will be appreciated that although the invention has been described in terms of NDR devices, the reference voltage generator circuit 60 would still work if the NDR device and its nearest pass transistor in the TCCT based memory cell 62 were replaced with some other current-producing memory device. Likewise, the NDR device and its nearest pass transistor in the two reference cells 64 and 66 can also be replaced with some other current-producing memory device. A reference voltage generator circuit 60 is also useable with a memory array 110 where the TCCT based memory cells are replaced with another current-producing memory device.

Figure 13:
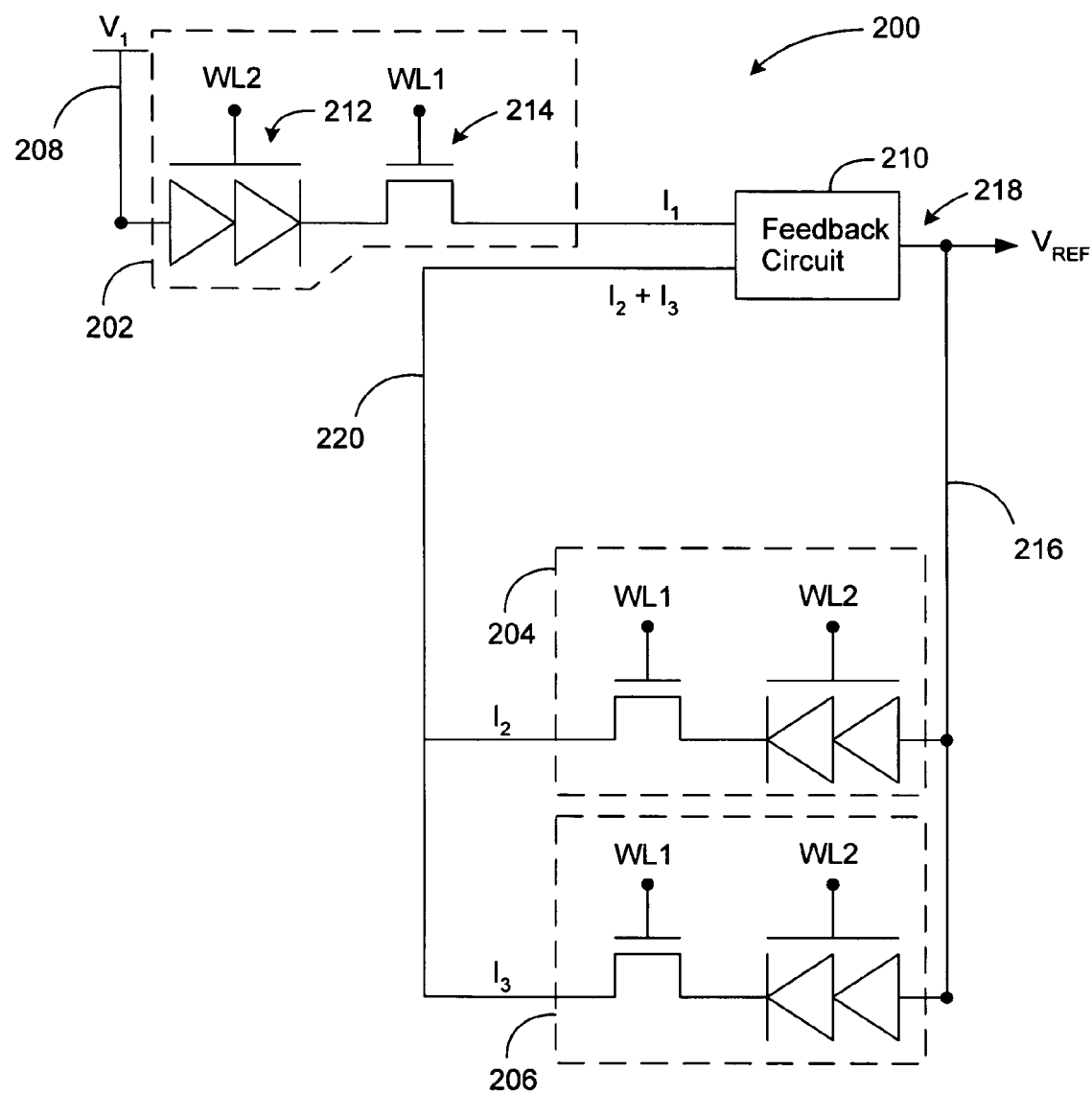
FIG. 13 shows a schematic circuit diagram of an exemplary NDR based reference voltage generator circuit according to another embodiment of the invention.

FIG. 13 is a schematic circuit diagram of another exemplary reference voltage generator circuit 200 of the invention. The reference voltage generator circuit 200 including a memory cell 202 and two reference cells 204 and 206. The memory cell 202 is coupled between a first line 208 at a first voltage $V_1$ and a feedback circuit 210, as shown. The memory cell 202 is configured to produce a first current $I_1$ that is received by the feedback circuit 210. In FIG. 13 the memory cell 202 is shown as a TCCT based memory cell including an NDR device 212 coupled to a pass gate 214, however, just as in FIGS. 6B, 6C, and 6D, the memory cell 202 can be of another type such as SRAM or MRAM, or can be a memory cell with a floating gate such as a flash memory cell.

Reference cells 204 and 206 are coupled in parallel between feedback circuit 210 and a second line 216 coupled to an output node 218 of feedback circuit 210. Reference cell 204 is configured to produce a second current $I_2$ and reference cell 206 is configured to produce a third current $I_3$, where both currents are received at the feedback circuit 210. The second and third currents can either be combined on a common line 220 as shown, or can be summed (i.e. combined) at the feedback circuit 210. In FIG. 13 the reference cells 204, 206 are shown as TCCT based reference cells, however, the invention will also work with other types of reference cells such as SRAM or MRAM, or a memory cell with a floating gate such as a flash memory cell.

The feedback circuit 210 operates as described above with reference to FIG. 6A to produce a reference voltage $V_{ref}$ at output node 218 by comparing the first current $I_1$ against the sum of the second current $I_2$ and the third current $I_3$. When the sum of the second current $I_2$ and the third current $I_3$ is less than the first current $I_1$ the reference voltage $V_{ref}$ is increased. By increasing the reference voltage $V_{ref}$ the voltage applied to the reference cells 204 and 206 is also increased. By increasing the voltage applied to the reference cells 204 and 206 both will produce more current until the sum of the second current $I_2$ and the third current $I_3$ is approximately equal to the first current $I_1$. Similarly, if the sum of the second current $I_2$ and the third current $I_3$ is more than the first current $I_1$ the reference voltage $V_{ref}$ is decreased by the feedback circuit 210 until the sum of the second current $I_2$ and the third current $I_3$ is approximately equal to the first current $I_1$.

Another exemplary reference voltage generator circuit includes reference cell 204 but omits reference cell 206. In this embodiment the feedback circuit 210 compares the second current $I_2$ to the first current $I_1$ and generates a reference voltage in response thereto. Here, the feedback circuit increases the reference voltage $V_{ref}$ when the second current $I_2$ is less than about half of the first current $I_1$ and decreases the reference voltage $V_{ref}$ when the second current $I_2$ is greater than about half of the first current $I_1$. Alternatingly, reference cells 204, 206 can be accompanied by one or more additional reference cells in parallel similar to the reference cells described in connection with FIG. 6A.

Figure 14:
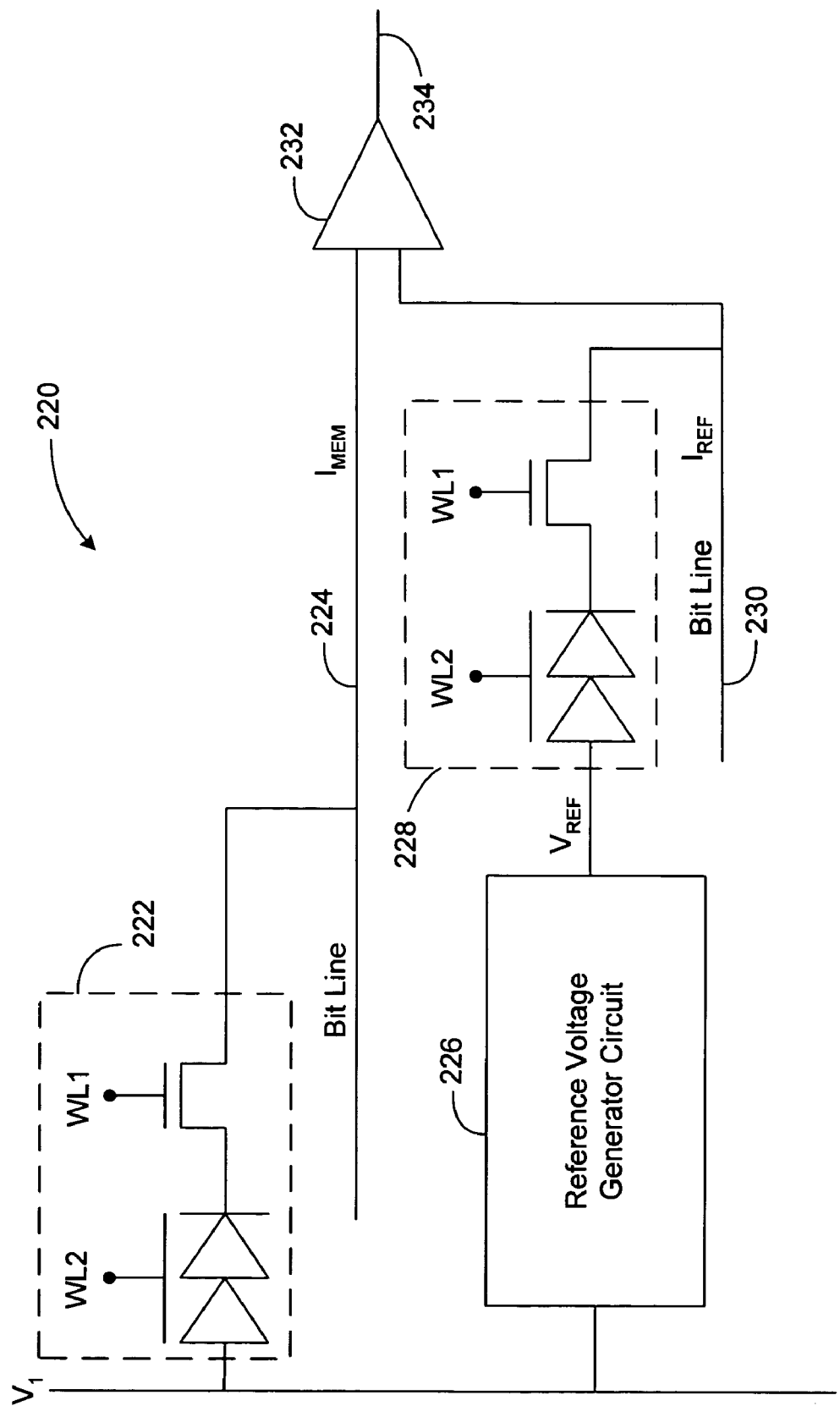
FIG. 14 shows a schematic circuit diagram of another exemplary memory array 220 of the invention.

FIG. 14 is a schematic circuit diagram of a representation of a portion of another exemplary memory array 220 of the invention. Memory array 220 includes a memory cell 222 coupled to a first bit line 224, and a reference voltage generator circuit 226 coupled to a reference cell 228 that is in turn coupled to a second bit line 230. A suitable reference voltage generator 226 for practicing the present invention is generator 200 shown in FIG. 13. The first and second bit lines 224 and 230 are each coupled to a sense amplifier 232.

In operation, a common voltage is applied to both the memory cell 222 and the reference voltage generator circuit 226, and the reference voltage generator circuit 226 outputs a reference voltage $V_{ref}$ that is applied to the reference cell 228. The reference cell 228 produces a reference current $I_{ref}$ that is supplied to the sense amplifier 232 by the second bit line 230. The memory cell 222 produces a memory current $I_{mem}$ that is supplied to the sense amplifier 232 by the first bit line 230. The memory current $I_{mem}$ is variable (i.e., has different current magnitudes to represent different logical states) and will be either higher or lower than the reference current $I_{ref}$ depending on a logical state stored in the memory cell 222. Accordingly, the sense amplifier 232 determines the logical state stored in the memory cell 222 by determining whether the memory current $I_{mem}$ is higher or lower than the reference current $I_{ref}$ and outputs the result as a data signal on line 234.

In the foregoing specification, the invention is described with reference to specific embodiments thereof, but those skilled in the art will recognize that the invention is not limited thereto. For example, the pass gates described above to generate a reference current can include a PMOS gate using a TCCT based memory cell with its cathode coupled to a $V_{dd}$ array. As another example, although the preceding discussion describes generating a reference current at one-half the current to be read, it is also within the scope of the present invention to generate a reference at any level proportionate to the TCCT based memory cell current. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive.

What is claimed is:

1. A memory array comprising:
   a memory cell having a first voltage applied thereto and including a logical state and configured to generate a first current on a first bit line;
   a reference voltage generator circuit having the first voltage applied thereto and configured to generate a reference voltage;
   a reference cell configured to receive the reference voltage and to generate a second current on a second bit line;
   means for determining the logical state of the memory cell by comparing the first current to the second current; and
   first and second word lines;
   wherein the memory cell is a TCCT based memory cell including an NDR device disposed adjacent to the second word line, and a pass transistor with a gate coupled to the first word line.

2. The memory array of claim 1 wherein the reference cell is a TCCT based cell including
   an NDR device disposed adjacent to the second word line, and
   a first pass transistor with a gate coupled to the first word line.

3. The memory array of claim 1 wherein the means for determining the logical state of the TCCT based memory cell is a sense amplifier.

* * * * *